United States Patent [19]

Pederson et al.

[11] 3,792,376

[45] Feb. 12, 1974

[54] HIGH EFFICIENCY TRANSISTOR ASTABLE MULTIVIBRATOR

[75] Inventors: Richard H. Pederson, Marshalltown, Iowa; Robert O. Gregory, St. Louis, Mo.

[73] Assignee: Monsanto Company, St. Louis, Mo.

[22] Filed: Apr. 18, 1972

[21] Appl. No.: 245,225

[52] U.S. Cl. ............................ 331/113 R, 331/144

[51] Int. Cl. ............................ H03k 3/282

[58] Field of Search.... 331/110, 113 R, 113 A, 111, 331/144

[56] References Cited

UNITED STATES PATENTS 3,105,944 10/1963 Lostetter........................ 331/113 A

*Primary Examiner*—Herman Karl Saalbach
*Assistant Examiner*—Siegfried H. Grimm
*Attorney, Agent, or Firm*—Peter S. Gilster; Harold R. Patton; Neal E. Willis

[57] ABSTRACT

Disclosed is a high efficiency oscillator circuit for use in a field transmitter of a process control system. The oscillator includes first and second current drive output transistors cross-coupled through a load to first and second current sink transistors, respectively, and these transistors are operatively biased for astable switching so that the first output and the first current sink transistors simultaneously conduct in one state of the oscillator and the second output and the second current sink transistors simultaneously conduct in another state of the oscillator. First and second series cut-off transistors are connected, respectively, between the first and second current sink transistors and each side of the load, and these latter transistors insure that one of the output transistors is clamped off when the other output transistor is biased into conduction. Turn on drive circuitry connected to each of the output transistors includes a pair of capacitors which discharge, respectively, into the pair of output transistors to alternately drive same into saturation as the circuit is switched. As a result, pairs of output and series cut-off transistors are simultaneously biased to saturation in series across the power supply, and thereby minimize voltage drops across the power supply and maximize the operational efficiency of the circuit.

4 Claims, 3 Drawing Figures

HIGH EFFICIENCY TRANSISTOR ASTABLE MULTIVIBRATOR

FIELD OF THE INVENTION

Figure 1:
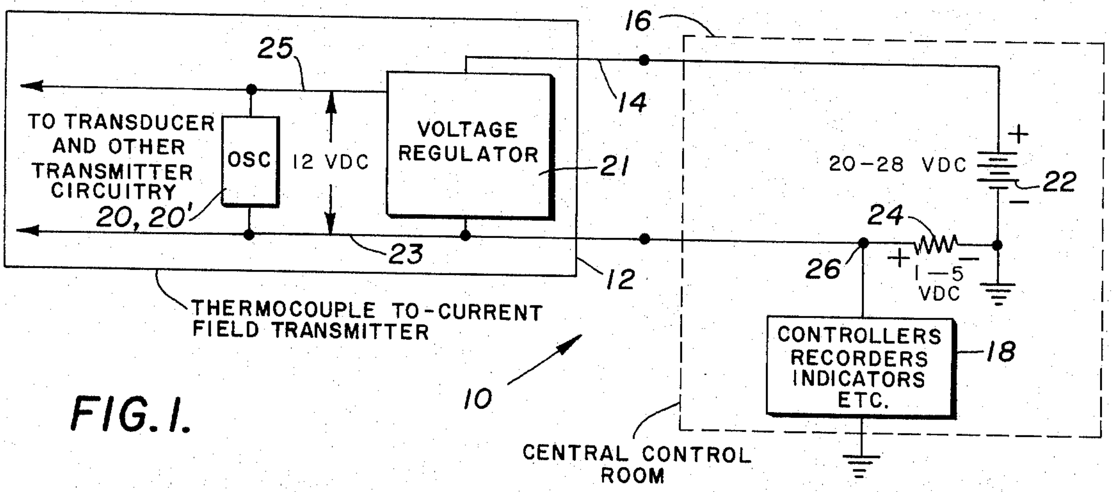

This invention relates generally to electronic oscillators used in field transmitters for use in process control systems. More particularly, the invention relates to a high efficiency transistorized oscillator of this type constituting a transistor astable multivibrator featuring improved current and voltage operating characteristics.

BACKGROUND

Field transmitters for use in industrial electronics, particularly industrial process control systems, frequently employ transistorized oscillators, such as cross-coupled transistor multivibrators, for use as a driver stage for chopping a low level, slowly varying analog signal output from a transducer of the transmitter. These multivibrators are used to excite power transformers from which isolated power can be derived. The signal which is chopped by the output of the transformer is then amplified in an AC amplifier and further processed in successive electronic stages to an appropriate level varying DC current for transmission to a central control room.

Cross-coupled transistor multivibrators of this type frequently include, among other components, a pair of alternately conducting output current drive transistors between which is connected an inductive load, such as a transformer winding. When these output current drive transistors are alternately biased into conduction during oscillator astable switching, the inductive load is driven by a square wave AC voltage which is transformer coupled to appropriate signal chopping devices, such as field effect transistors, for chopping the analog signal from the transducer in the field transmitter.

PRIOR ART

A well known prior art oscillator circuit used for the generation of a square wave signal voltage in the above type of field transmitters employs pairs of alternately conducting, output current drive transistors which are cross-coupled to each other through a transmitter transformer winding. The latter transistors are further serially connected, respectively, through a pair of transistor cut-off diodes to pairs of alternately switching current sink transistors; separate ones of the cross connected output current drive transistors and separate ones of the current sink transistors simultaneously conduct as the oscillator is switched from one to the other of its two conductive states during astable or free-running operation. The above series-connected diodes are required in this prior art oscillator circuit in order to insure that one of the output transistors is turned completely off as conduction is initiated in the other output transistors, thereby insuring that a good sharp square wave output voltage is developed across the transformer winding. These diodes, together with other associated circuit resistors, render this prior art oscillator circuit inefficient in operation and unsuitable for use in field transmitters which must operate from relatively low level DC voltage supplies. The specific shortcomings of this prior art circuit design will be more fully described hereinafter with reference to the prior art circuit of FIG. 2.

THE INVENTION

The general purpose of this invention is to provide a free-running oscillator having all of the operational advantages of the above described prior art oscillator circuit, while simultaneously overcoming its problem of inefficiency. To attain this purpose, a new and improved transistorized multivibrator-type oscillator has been constructed and includes, among other components, a pair of series cut-off transistors interconnected, respectively, between separate ones of a pair of output current drive transistors and separate ones of a pair of current sink transistors. These series cut-off transistors not only eliminate the need for two diode drops ($2V_{BE}$) in series with the power supply at all times during the circuit operation, but also substantially reduce the input current requirements for the circuit during its switching operation.

Accordingly, an object of the present invention is to provide a novel transistor oscillator circuit exhibiting improved operating efficiency.

Another object of this invention is to provide an oscillator of the type described which is especially well suited for use in temperature-to-current, pressure-to-current and other like parameter converting field transmitters.

A further object of this invention is to provide a multivibrator type oscillator circuit of the type described capable of operating from relatively low level D.C. supply voltages and which requires relatively low level input currents for its proper astable switching operation.

These and other objects and features of this invention will become more readily apparent from the following description.

DRAWING

Figure 2:
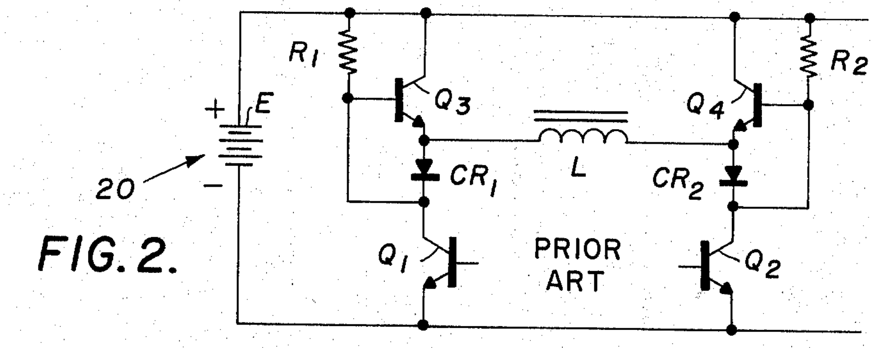
Figure 3:
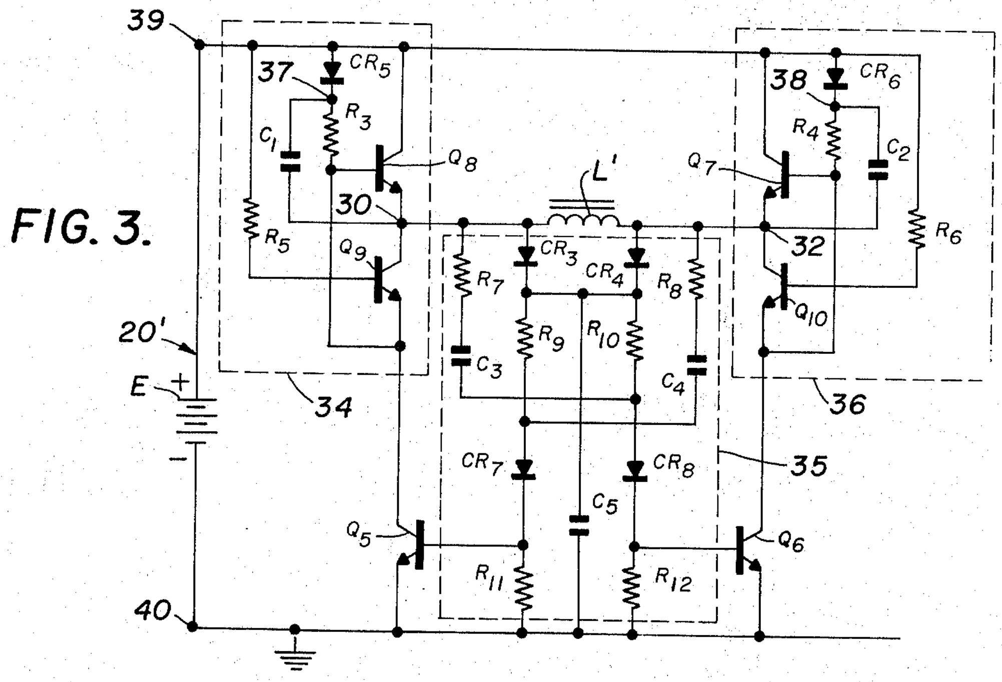

FIG. 1 is a functional block diagram of a control system utilizing the present invention;

FIG. 2 is a schematic diagram of a portion of the above described prior art oscillator circuit; and FIG. 3 is a schematic diagram of the cross-coupled multivibrator circuit which constitutes a preferred embodiment of this invention. DETAILED DESCRIPTION Referring now to FIG. 1, a temperature-to-current process control system, generally designated 10, comprises a field transmitter 12 which is interconnected over a two wire line 14 to a central control room 16 in which controllers, recorders, or indicators, all designated as 18, or other like equipment are observable and controllable by a control room operator. The field transmitter 10 may include, among other components, a temperature-to-current type transducer which comprises a thermocouple sensor and its associated temperature-to-current (T/I) circuitry (all not shown) for generating the required range of DC current which is transmitted via line 14 to the central control room 16. Typically, this current range will be either 4–20 milliamperes or 10–50 milliamperes, both ranges being convertible to a voltage range of 1–5 volts at node 26 by the proper selection of resistor 24. If the current range is 4–20 milliamperes, the resistor 24 is 250 ohms, and if the current range is 10–50 milliamperes, the resistor 24 is 100 ohms. Normally, the T/I circuitry within the field transmitter 12 requires an oscillator 20, 20' which must operate from the regulated output voltage of a voltage regulator 21, and this voltage across the oscillator can be as low as 12 volts DC. This oscillator 20, 20' provides an AC chopping voltage for chopping a low level DC analog output signal from the temperature sensor within the field transmitter 12, and this signal is fed via line 23 to the control room instrumentation 18.

For some prior art systems of the above type, the supply voltage 22 is in the order of 45 to 65 volts DC, in which case there is ample DC voltage at the transmitter 12 for supplying the necessary power to the various components and stages within the field transmitter 12. However, more recently and in order to meet safety requirements, the level of the supply voltage 22 has been reduced to 24 volts DC, which means that under worst case conditions the supply voltage on line 14 may drop as low as 20 volts DC. Thus, the field transmitter 12 should be designed to operate satisfactorily under this worst case condition.

During this above worst case condition, a maximum of 5 volts DC must be available at node 26 to accommodate the 1–5 volt range required by the instrumentation 18. Thus, under this worst case condition, there will be only 15 volts DC across the field transmitter 12 for supplying all of the power requirements for the transmitter. The voltage regulator 21, which commonly includes a series pass transistor and one or more diodes connected thereto (all not shown), consumes approximately 3 volts, so only approximately 12 volts are available across lines 23 and 25 for powering the remaining components in the transmitter 12. Such a power supply constraint placed upon the process control system 10 means that the field transmitter 12 must be designed for extremely efficient operation and minimum power dissipation. For example, when the total system 10 is operating from plus 15 volts DC on line 14 and a current of 4 milliamperes is conducted by the oscillator 20', there is a maximum power of 60 milliwatts which can be dissipated in the entire transmitter 12 of which the oscillator 20, 20' is only one small subsystem. In addition to the oscillator, 20, 20', the entire transmitter 12 must also contain an AC amplifier, a precision voltage regulator and other circuitry for conditioning the transducer signal.

Referring now to FIG. 2, there is shown only the output circuitry of a prior art oscillator circuit, generally designated 20, and this output circuitry includes first and second current sink transistors Q1 and Q2 which are serially connected via first and second transistor cut-off diodes CR1 and CR2, respectively, to a pair of output current drive transistors Q3 and Q4. An inductive load L, such as a transformer winding, is connected as shown between the emitters of Q3 and Q4. A pair of base drive resistors R1 and R2 are connected, respectively, as shown between the bases of Q3 and Q4 and one side of the voltage supply E, and these resistors are also directly connected to the collectors of the current sink transistors Q1 and Q2. In operation, transistors Q1 and Q4 simultaneously and serially conduct current through the load L in one direction when the oscillator 20 is in one of its two conductive states, and the other transistor pair Q2 and Q3 will conduct current through the load L in the opposite direction when the oscillator switches to its other conductive state during free running or astable operation.

During this switching operation, the diodes CR1 and CR2 insure that one of the respective output transistors Q3 and Q4 is turned completely off as the other output transistor Q4 and Q3 is turned on. Thus, when transistor Q4 is conducting current through the load L, through CR1 into the collector of transistor Q1 during one of the two conductive states of the oscillator 20, the diode drop ($V_{BE}$) across CR1 insures that the transistor Q3 is clamped off. However, during this time there is in series across the supply voltage E the diode drop of CR1 plus the diode drop of the emitter-base junction of the transistor Q4, since the latter device is not in saturation. These two diode drops ($2V_{BE}$) are in the order of 1.2 volts and represent a significant voltage requirement if the line voltage on line 14 is relatively low in the order of 15 volts DC as previously described. Additionally, this low level line voltage requires that the voltage drop across the base resistors R1 and R2 be held to a minimum value, and this requirement in turn dictates that relatively low valued resistors must be used for R1 and R2. Consequently, a significant current flows through these resistors when transistors Q1 and Q2 are turned on. This latter current requirement produces a second inefficiency in the prior art circuit of FIG. 2 as a result of its attendant power dissipation, and thereby renders this circuit unsuitable for field transmitter applications which must operate from a relatively low level DC voltage supply in the order of 24 volts DC. The circuit schematically illustrated in FIG. 3 has been designed in a novel manner to overcome the operational inefficiencies of the prior art circuit of FIG. 2.

Referring now to FIG. 3, the multivibrator type transistor oscillator embodying the invention is designated generally as 20' and includes first and second current sink transistors Q5 and Q6 which are cross-coupled to pairs of output current drive transistors Q7 and Q8 via a pair intermediate, series cut-off transistors Q9 and Q10 to be further described. An inductive load L', which may be one winding of a transformer, is connected between circuit nodes 30 and 32 at the emitters of the output transistors Q8 and Q7, respectively. The transistors Q8 and Q9 and the transistor Q7 and Q10 form part of a pair of symmetrical turn on drive networks 34 and 36 which will be operationally described in detail below. The transistors Q5, Q7 and Q9 simultaneously conduct current through the load L' in one direction when the oscillator is in one conductive state, and these three transistors turn off when the transistors Q6, Q8 and Q10 turn on to conduct current through the load L in the opposite direction when the conductive state of the oscillator 20' changes. As in the case for the operation of the two diodes CR1 and CR2 in the prior art circuit of FIG. 2, the first series cut-off transistor Q9 insures that the output current drive transistor Q8 is maintained completely cut off when transistor Q7 conducts, and similarly, the second series cut-off transistor Q10 insures that the output current drive transistor Q7 is turned completely off when transistor Q8 is biased to conduction.

The current sink transistors Q5 and Q6 are cross-coupled via a coupling network 35 which employs astable cross-coupling techniques to insure free running oscillations in the circuit 20', and this network 35 will be described before proceeding with the description of the turn on drive networks 34 and 36. The cross coupling network 35 includes capacitors C3 and C4 which are connected to their associated timing resistors R10 and R9, respectively, as shown, and the RC time constant of these two RC networks establishes the switching time for the circuit 20'. A pair of diodes CR7 and CR8 interconnect the lower electrodes of the capacitors C4 and C3 to the respective bases of the current sink transistors Q5 and Q6 and serve to limit the reverse voltage on transistors Q5 and Q6 when these latter transistors are turned off. The resistors R7 and R8 are current limiting resistors for the bases of transistors Q6 and Q5, respectively, and these resistors affect the time constant of the circuit to a small degree. However, resistors R7 and R8 are mainly for the purpose of limiting the current in the cross coupling network 35 when the capacitors C3 and C4 charge through the saturated transistors Q7 and Q8 during circuit operation.

The appropriate DC bias potentials for the current sink transistors Q5 and Q6 are provided by the filter capacitor C5 in combination with the two diodes CR3 and CR4, and these diodes rectify the AC voltage which is developed across the transformer winding L'. This rectified voltage is filtered by capacitor C5 and serves as the operating potential for the timing resistors R9 and R10 and for the diodes CR7 and CR8. This voltage is coupled through the resistors R9 and R10 to the bases of transistors Q5 and Q6 and provides appropriate DC biasing for the latter transistors. This biasing connection insures that the circuit will begin to oscillate immediately upon connecting the voltage supply E to the voltage supply terminals 39 and 40.

The turn-on drive networks 34 and 36 include, respectively, diodes CR5 and CR6 which are serially connected as shown to resistors R3 and R4 between the voltage supply E and the bases of transistors Q8 and Q7. Charge storage capacitors C1 and C2 are connected, respectively, between the circuit nodes 37 and 38 and circuit nodes 30 and 32, and provide turn on drive current for saturating the current drive transistors Q8 and Q7 as these latter transistors are turned on. A pair of relatively large current limiting resistors R5 and R6 are connected as shown between the power supply terminal 39 and the bases of series cut-off transistors Q9 and Q10, respectively, and these latter resistors bleed only very low currents into the bases of transistors Q9 and Q10 as these latter transistors are turned on. It should be observed here that the collectors of the current sink transistors Q5 and Q6 are not connected through resistors directly to the power supply terminal 38, so that transistors Q5 and Q6 dissipate a minimum of power during circuit operation.

SWITCHING OPERATION OF FIG. 3

Assume that the first output current drive transistor Q7 is conducting current through the load L', into the collector of a first series cut-off transistor Q9 and into the collector of a first current sink transistor Q5. During this time, transistors Q8, Q10 and Q6 are cut off, and the circuit node 30 is at a potential of $2V_{CE(SAT)}$, which is in the order of 0.1 volt above ground potential. With the voltage at node 30 at $2V_{CE(SAT)}$, the first current drive transistor Q7 is now in saturation, thus eliminating the second diode drop which was previously in series across the supply voltage E (see above description of the prior art circuit of FIG. 2). During this condition, the capacitor C1 is charged from the supply voltage E and through CR5, Q9 and Q5 to a voltage close to the supply voltage E. Now, at the instant Q5 turns off during a change in the conductive state of the multivibrator 20', the collector of Q9 immediately rises to approximately E, and this change in potential is coupled through capacitor C1 to drive its upper electrode to approximately 2E. This change in potential back biases CR5 to terminate any further conduction through CR5, and at this point C1 discharges through R3 and into the base of transistor Q8 to drive Q8 into saturation, and now current flows in the opposite direction through the load L' and through transistors Q10 and Q6. The RC time constant of C1 and R3 is sufficiently long to hold the full value of the supply voltage E across R3 for each half cycle of operation and thereby maintain saturation in transistor Q8 during this time. With transistor Q8 in saturation, the previous diode drop or $V_{BE}$ of the current drive transistor is removed, thereby eliminating the other 0.6 volt drop series with a transformer winding L during circuit operation. Furthermore, since a voltage of approximately E is constantly maintained across the base resistors R3 and R4, then the resistors R3 and R4 can be made much larger in magnitude than the corresponding base resistors of the prior art circuit in FIG. 2, and this feature contributes to substantially reducing the power dissipation in the circuit when transistors Q7 and Q8 are turned on. Thus, there is a negligible power loss in the circuit of FIG. 3 as a result of transistor base current bleeding through base resistors R3 and R4.

Therefore, the effect of the novel improvements of the circuitry of FIG. 3 over the prior art circuitry FIG. 2 is not only the elimination of two diode drops in series with the power supply E at all times, but also the substantial increasing of the circuit resistance across the power supply. This resistance has been increased by several orders of magnitude, to thereby reduce the current requirements of the circuit.

The following table lists the component values for a circuit of the type described in FIG. 3 above which has been successfully reduced to practice. However, this table should not be construed in any manner as limiting the scope of this invention. The purpose of this table is merely to facilitate the rapid connection of said circuit by an engineer or technican.

| Component | Value or Type |
|---|---|
| Q1 | NPN 1/5 RCA Type CA3046 |
| Q2 | NPN 1/5 RCA Type CA3046 |
| Q3 | NPN 1/5 RCA Type CA3046 |
| Q4 | NPN 1/5 RCA Type CA3046 |
| Q5 | NPN 1/5 RCA Type CA3046 |
| Q6 | NPN 1/5 RCA Type CA3046 |
| Q7 | NPN 1/5 RCA Type CA3046 |
| Q8 | NPN 1/5 RCA Type CA3046 |
| Q9 | NPN 1/5 RCA Type CA3046 |
| Q10 | NPN 1/5 RCA Type CA3046 |
| C1 | 0.1 MFD |
| C2 | 0.1 MFD |
| C3 | .033 MFD |
| C4 | .033 MFD |
| C5 | 0.1 MFD |
| R1 | 2700 OHMS |
| R2 | 2700 OHMS |
| R3 | 56000 OHMS |
| R4 | 56000 OHMS |
| R5 | 100000 OHMS |
| R6 | 100000 OHMS |
| R7 | 10000 OHMS |
| R8 | 10000 OHMS |
| R9 | 82000 OHMS |
| R10 | 82000 OHMS |
| R11 | 100000 OHMS |
| R12 | 100000 OHMS |

In view of the foregoing, it will be seen that the several objects of the invention are achieved and other advantageous results attained.

As various changes could be made in the constructions herein described without departing from the scope of the invention, it is intended that all matter contained in the above description shall be interpreted as illustrative and not in a limiting sense.

We claim:

1. A high efficiency oscillator circuit which minimizes voltage drops across a power supply for said circuit, said circuit comprising:

first and second current drive transistors each connected in common-emitter configuration with the collector and emitter terminals thereof connected in a circuit between a first power supply terminal and a respective one of a pair of load terminals, said current drive transistors being adapted to be alternately driven between cut-off and saturation;

first and second current sink transistors each connected in common-emitter configuration with one of the collector and emitter terminals thereof connected to a second power supply terminal, said current sink transistors being adapted to be alternately driven between cut-off and saturation;

first and second series cut-off transistors each connected in common-emitter configuration with the collector and emitter terminals thereof connected between a respective one of the load terminals and the other of the collector and emitter terminals of a respective one of said current sink transistors, said series cut-off transistors being adapted to be alternately driven between cut-off and saturation;

a coupling circuit including a first resistor and capacitor connected in series between one of said load terminals and the base terminal of one of said current sink transistors and a second resistor and capacitor connected in series between the other of said load terminals and the base terminal of the other of said current sink transistors, said coupling circuit alternately biasing said first and second current sink transistors into saturation simultaneously with alternate corresponding saturation of corresponding ones of said first and second current drive transistors and simultaneously with alternate corresponding saturation of corresponding ones of said first and second series cut-off transistors;

whereby current is switched in alternate directions through a load connected across said load terminals by alternate paths each constituted by the respective collector-emitter circuits of one of said current drive transistors, one of said series cut-off transistors, and one of said current sink transistors.

2. The circuit defined in claim 1 which further includes turn-on drive circuit means interconnected between said first power supply terminal and electrodes of said first and second current drive transistors for alternately driving said first and second current drive transistors into saturation and for maintaining a required high level of bias voltage for said current drive transistors as they are alternately driven into saturation.

3. The circuit defined in claim 2 wherein said turn-on drive circuit means includes:

a. a first capacitor and a first resistor interconnected between the emitter and base of said first current drive transistor for being charged via said first power supply terminal to provide turn-on current drive to said first current drive transistor and b. a second capacitor and a second resistor interconnected between the emitter and base of said second current drive transistor for being charged via said first power supply terminal to provide turn-on current drive to said second current drive transistor, whereby said first and second resistors may be of relatively large valued resistances thereby to minimize power dissipation in said circuit while said first and second capacitors discharge therethrough into the bases of said first and second current drive transistors, respectively, to drive same into saturation.

4. The circuit defined in claim 3 wherein said turn-on drive circuit means further includes:

a. first and second current-limiting base resistors interconnecting, respectively, the bases of said first and second series cutoff transistors and said first power supply terminal and limiting the base current drive thereto during circuit operation, and b. first and second diodes interconnected between said first and second capacitors, respectively and said first power supply terminal for confining the discharge of said first and second capacitors to said first and second current drive transistors as said first and second current drive transistors are alternately driven into saturation.

* * * * *